United States Patent [19]

Hsue

[11] Patent Number: 5,392,293

[45] Date of Patent: Feb. 21, 1995

[54] BUILT-IN CURRENT SENSOR FOR $I_{DDQ}$ TESTING

[75] Inventor: Ching-Wen Hsue, Plainsboro, N.J.

[73] Assignee: AT&T Corp., Murray Hill, N.J.

[21] Appl. No.: 23,458

[22] Filed: Feb. 26, 1993

[51] Int. Cl.⁶ .............................................. G01R 31/28
[52] U.S. Cl. .................................. 371/15.1; 324/158.1
[58] Field of Search ..................... 371/15.1, 21.4, 25.1, 371/21.3, 27, 3, 72, 23, 24, 22.5; 324/73.1, 158 R; 340/650, 636, 825.54, 928; 307/311, 296.8, 296.7; 361/42, 86, 101, 90-92, 88

[56] References Cited

U.S. PATENT DOCUMENTS

| | | | |
|---|---|---|---|
| 3,939,399 | 2/1976 | Funaku et al. | 323/22 T |
| 4,122,402 | 10/1978 | Main | 330/288 |
| 4,319,179 | 3/1982 | Jett, Jr. | 361/18 |
| 4,398,160 | 8/1983 | Neidorff | 307/297 |
| 4,631,724 | 12/1986 | Shimizu | 371/21.4 |
| 4,637,020 | 1/1987 | Schinabeck | 371/20.4 |
| 4,646,299 | 2/1987 | Schinabeck et al. | 371/20.4 |
| 4,849,847 | 7/1989 | McIver et al. | 361/88 |
| 5,025,344 | 6/1991 | Maly et al. | 361/88 |
| 5,057,774 | 10/1991 | Verhelst et al. | 371/22.5 |

OTHER PUBLICATIONS

W. Maly and P. High, "Built-In Current Testing—Feasibility Study," published in the conference proceedings of the *IEEE International Conference on Computer-Aided Design*, Santa Clara, Calif., Nov. 7-10, 1988, at pp. 340-343.

Primary Examiner—Robert W. Beausoliel, Jr.
Assistant Examiner—Dieu-Minh Le
Attorney, Agent, or Firm—Robert B. Levy

[57] ABSTRACT

A current sensor (10), for sensing a quiescent current ($I_{DDQ}$) drawn by an integrated circuit (12) from a supply voltage $V_{DD}$ includes a current sink and voltage transducer (14) for sinking current from the integrated circuit during a logic transition and for providing a voltage indicative of the quiescent current when the circuit operates in its quiescent state. A comparator (18) compares this voltage to a reference voltage representative of a prescribed quiescent current. The comparator is coupled to a preamplifier stage (38) which serves to generate an indicating voltage in accordance with the comparator output signal. The indicating voltage from the preamplifier stage is stabilized by a stabilizing circuit (58) against variations in the supply voltage $V_{DD}$ to assure that the indicating voltage provides an accurate measure of whether the quiescent current $I_{DDQ}$ is above or below a prescribed current.

12 Claims, 1 Drawing Sheet

BUILT-IN CURRENT SENSOR FOR $I_{DDQ}$ TESTING

TECHNICAL FIELD

This invention relates to a method and apparatus for measuring the quiescent current ($I_{DDQ}$) of a device to detect possible faults therein.

BACKGROUND OF THE INVENTION

In the past, integrated circuits, including those employing Complementary Metal Oxide Silicon (CMOS) logic, have been tested by applying one or more strings of binary values (vectors) to the input(s) of the integrated circuit over time and then observing the response to each applied vector. By comparing each observed response to the corresponding response expected for a fault-free integrated circuit, faults in the circuit can be detected. The degree to which the faults in an integrated circuit manifest themselves, usually described in terms of fault coverage, is dependent on the size of the vector set applied to the integrated circuit.

Another technique for testing a CMOS integrated circuit is to measure the current ($I_{DDQ}$) during the interval when the integrated circuit is operating in its quiescent state. A fault-free CMOS integrated circuit draws no current in its quiescent state, whereas a defective CMOS device typically draws a small amount of drain (source) current. A distinct advantage of testing a CMOS device by measuring its quiescent current $I_{DDQ}$ is that the number of vectors required to achieve a certain level of fault coverage is much smaller as compared to conventional testing techniques.

To date, implementation of $I_{DDQ}$ testing has been hindered by the need for special purpose testing equipment external to the integrated circuit being tested. Another factor hindering implementation of $I_{DDQ}$ testing has been the need carry out such testing at a much slower rate than conventional testing because of testing speed restrictions imposed by the manner in which such equipment must be coupled to the integrated circuit(s) under test.

Thus, there is need for a technique for carrying out $I_{DDQ}$ testing which overcomes the aforementioned disadvantages.

SUMMARY OF THE INVENTION

Briefly, in accordance with the invention, there is provided a current sensor, which may be incorporated directly within a CMOS integrated circuit, for measuring the quiescent current $I_{DDQ}$ of the integrated circuit. The current sensor of the invention includes a current sink and voltage transducer which serves to sink current during intervals when the integrated circuit is undergoing a logic transition, and which serves to provide a voltage indicative of the quiescent current when the integrated circuit is in its quiescent state. A voltage comparator compares the voltage produced by the current sink and voltage transducer to a reference voltage indicative of a prescribed quiescent current. A preamplifier stage receives the output of the voltage comparator and generates an indicating voltage indicative of the difference between the reference voltage and the voltage of the current sink and voltage transducer, and hence indicative of whether the quiescent current exceeds an predetermined value. A voltage stabilizer stabilizes the indicating voltage of the preamplifier stage against variations in the supply voltage, which is powering the integrated circuit, to achieve an accurate measurement of the quiescent current $I_{DDQ}$.

The current sensor of the invention is designed for fabrication within a CMOS integrated circuit to allow for $I_{DDQ}$ current measurement without the need for specialized test equipment. By integrating the current sensor of the invention within a CMOS integrated circuit, transmission losses between the current sensor and the circuit itself are minimized so that testing can be carried out at much higher speeds than was previously accomplished.

DETAILED DESCRIPTION

Figure 1:
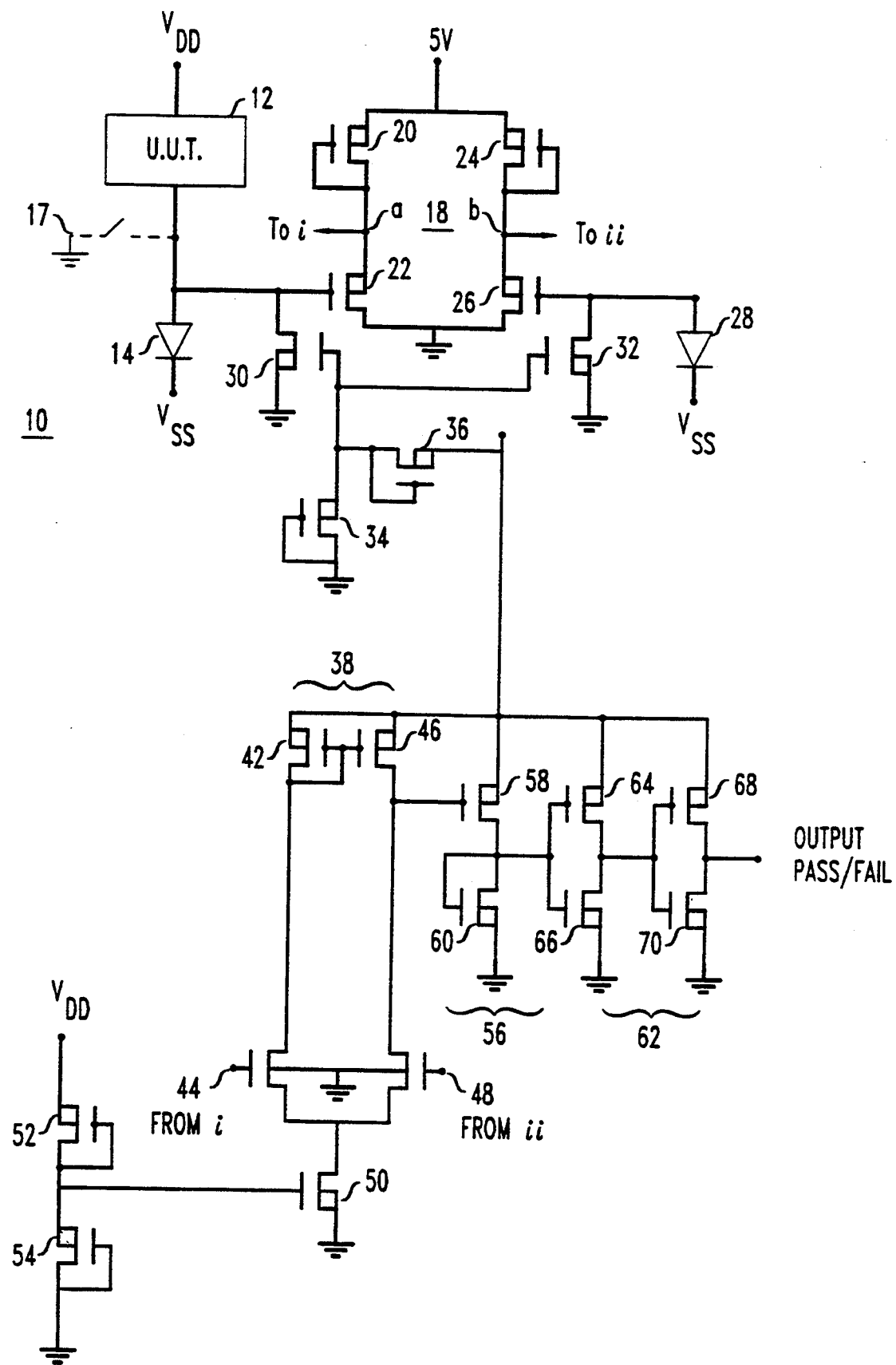
FIG. 1 is block schematic diagram of a current sensor, in accordance with a preferred embodiment of the invention, that may be incorporated in a CMOS integrated circuit for measuring the quiescent current of the circuit.

FIG. 1 illustrates the schematic details of a current sensor 10, in accordance with a preferred embodiment of the invention, for measuring the quiescent current ($I_{DDQ}$) drawn by a unit under test 12, typically, a CMOS integrated circuit, to detect faults, if any, therein. In practice, the current sensor 10 is formed integrally with the integrated circuit 12 on a single semiconductor medium, such as a silicon wafer (not shown).

The current sensor 10 includes a current sink and voltage transducer 14. As will be described below, the transducer 14 operates to sink current when the integrated circuit 12 undergoes a logic transition and also provides a voltage indicative of the quiescent current drawn by the integrated circuit when operating in its quiescent state. The current sink and voltage transducer 14 is typically configured of a diode coupled in series-aiding fashion with the integrated circuit 12 between the integrated circuit supply voltage $V_{DD}$ and a negative bias voltage $V_{SS}$, typically $-0.5V$. By coupling the anode of the diode 14 to the $V_{SS}$ supply, the junction between the diode and the integrated circuit 12 will be held at a level very close to circuit ground so as not to adversely affect the operation of the integrated circuit 12.

To further avoid having the diode 14 interfere with the operation of the integrated circuit 12 during non-testing intervals, it may be desirable to provide a single-pole, single-throw switch 17 (shown in phantom) coupled between circuit ground and the junction of the diode and the integrated circuit. The switch 17 is closed during normal operation of the integrated circuit 12 to effectively shunt the diode 14 so that no current passes therethrough. When the switch 17 is open, then current passes in the diode 14, causing a voltage to appear thereacross in proportion to the current.

The advantage of employing the diode 14 as the current sink and transducer is that the diode is a non-linear device having a low conducting state and high conducting state of operation. The diode 14 operates in its low conducting region when the voltage thereacross is relatively small (i.e. $<0.4V$). Thus, in the low conducting state, the diode 14 has a small current thereacross proportional to the voltage thereacross. In contrast, when operating in its high conducting state, the diode 14 will pass a large current. Thus, the diode 14 will advantageously operate as a current sink to sink a large amount of current when the integrated circuit undergoes a logic transition. Yet, when the integrated circuit 12 operates in its quiescent state, the diode 14 acts as a voltage transducer to provide a voltage indicative of the integrated circuit 12 quiescent current.

The voltage appearing across the diode 14 is received at a first input of a voltage comparator stage 18 comprised of two pairs of p-channel field effect transistors 20 and 22 and 24 and 26. The transistors of each pair have their drain-to-source portion coupled in series-aiding fashion with the drain-to-source portion of the other transistor of the pair between the positive terminal (5V) a five-volt voltage supply, and circuit ground to which the negative terminal of the supply is connected. The transistor 20 has its gate coupled to the junction between the transistors 20 and 22 (which is designated as node "a"). The gate of the transistor 24 is coupled to the junction between the transistors 24 and 26 (which is designated as "b"). As thus described, the voltage comparator 18, is symmetrical which assures for more accurate conversion of the $I_{DDQ}$ current, as sensed by the diode 14, into a corresponding voltage, and for ease of adjustment of the DC operating point of the current sensor 10.

The gate of the transistor 26 is coupled to the cathode of a diode 28 whose anode is coupled to the same $V_{ss}$ supply as the diode 14. The diode 28 provides a reference voltage to the comparator stage 18 against which the voltage across the diode 14 is compared. Since both the diodes 14 and 28 have their anode coupled to same negative bias voltage, the current sensor 10 is thus "balanced" so that its operation will not be affected by variations in the level of the negative bias supply.

The voltage levels across the diodes 14 and 28, and hence the current sensitivity of the current sensor 10, are controlled by a pair of p-channel field effect transistors 30 and 32, each having its drain-to-source portion coupled between the cathode of a respective one of the diodes 14 and 28, and circuit ground. Each of the transistors 30 and 32 has its gate coupled to the drain of p-channel field effect transistor 34 whose gate and source are coupled to circuit ground. The drain of the transistor 34 is coupled to the source and gate of a p-channel field effect transistor 36 whose drain is coupled to the supply voltage $V_{DD}$.

The transistors 34 and 36 function as a resistive voltage divider network and thereby control the current in the transistors 30 and 32. In turn, the current in each of the transistors 30 and 32 regulates the current in, and hence the voltage across, a separate one of the diodes 14 and 28, respectively. By regulating the voltage across the diodes 14 and 28, the sensitivity of the current sensor 10 can itself be controlled. In practice, the current in the transistors 30 and 32 can be set to a particular level by properly selecting the physical size of the transistors and the doping profiles thereof during fabrication of the current sensor 10.

Nodes a and b, which designate the junction between the transistors 20 and 22 and between the transistors 24 and 26, respectively, serve as first and second outputs, respectively, of the voltage comparator stage 18. The voltage present at the nodes a and b depends on the voltage across, and hence the current through, a separate one of the diodes 14 and 28. During operation of the current sensor 10, the current in the diode 28 remains constant whereas the current in the diode 14 varies with the current in the integrated circuit 12. Thus, during operation of the integrated circuit 12 in its quiescent mode, the voltage at node a will differ from that at node b by the difference between the actual quiescent current $I_{DDQ}$ of the integrated circuit and a predetermined quiescent current.

The nodes a and b of the comparator stage 18 are coupled to the inputs i and ii, respectively, of a preamplifier stage 38, comprised of first and second pairs of field effect transistors 42 and 44 and 46 and 48. The transistors 42 and 46 each comprise p-channel field effect transistors whereas the transistors 44 and 48 each comprise n-channel field effect transistors. The transistors 42 and 44 and 46 and 48 of the first and second pairs, respectively, have their drain-to source portion coupled in series-aiding fashion with the drain-to-source portion of the other transistor of the same pair between the supply voltage $V_{DD}$ and the source of a p-channel field effect transistor 50 whose drain is coupled to circuit ground.

The p-channel transistors 42 and 46 have their gates coupled to the junction between the transistors 42 and 44, whereas the gate of each of the n-channel transistors 44 and 48 serves as a separate one of the inputs i and ii, respectively, of the pre-amplifier stage 38. The bulk substrates of the n-channel transistors 44 and 48 are coupled to circuit ground. The transistor 50 has its gate coupled to the junction between a pair of p-channel field effect transistors 52 and 54 which have their drain-to-source portions coupled in series-aiding fashion between the supply voltage $V_{DD}$ and circuit ground. Each of the transistors 52 and 54 has its gate coupled to its source. Like the transistors 34 and 36, the transistors 52 and 54 act like a resistive voltage divider to control the current in the transistor 50.

The junction between the transistors 46 and 48 of the second transistor pair serves as the output for the pre-amplifier stage 38 which is coupled to the input of a Q-point stabilization stage 56. As will be described, the stabilization stage 58 serves to stabilize the output of the preamplifier stage 38 (i.e., the difference between the predetermined reference voltage and the voltage representative of the quiescent current $I_{DDQ}$) against variations in the device supply voltage $V_{DD}$. In the preferred embodiment, the stabilization stage 56 includes a pair of p-channel field effect transistors 58 and 60, each having its drain-to-source portion coupled in series-opposing fashion with that of the other transistor between the supply voltage $V_{DD}$ and circuit ground. The gate of the transistor 58, which serves as the input to the stabilization stage 56, is coupled to the junction between the transistors 46 and 48 of the preamplifier stage 38. The gate of the transistor 58 is coupled to the junction between the transistors 58 and 60 and serves as the output of the stabilization stage 56.

The stabilization stage 56 operates to stabilize the output voltage of the preamplifier stage 38 in the following manner. When the source voltage $V_{DD}$ decreases, then the voltage at the drain of the transistor 46 will decrease accordingly. As a result, the voltage at the gate of the transistor 58 will likewise decrease, causing a decrease in the gate-to-source voltage of the transistor 58. However, a decrease in the supply voltage $V_{DD}$ also will cause a decrease in the drain-to-source voltage of the transistor 58, thus maintaining the drain current of that transistor relatively constant. With the drain current constant, the voltage at the junction between the transistors 58 and 60 (i.e., the output of the stabilizing stage 56) is effectively stabilized. Any increases in the supply voltage $V_{DD}$ are stabilized in a similar manner.

An amplifier-inverter stage 62 is coupled to the stabilizing stage 58 and serves to amplify and invert the voltage present at the output of that stage. The amplifier-inverter stage 62 includes a first and second pair of p-channel field effect transistors 64 and 66 and 68 and 70. The transistors 64 and 66 and 68 and 70 of the first and second pairs, respectively, each have their drain-to-source portions coupled in series-opposing fashion with the other transistor of same the pair between the supply voltage $V_{DD}$ and circuit ground. The gate of each of the transistors 64 and 66 of the first pair is coupled to the junction between the transistors 58 and 60 of the stabilizing stage 56, whereas the gate of each of the transistors 68 and 70 of the second pair is coupled to the junction between the transistors 64 and 66.

At the junction between the transistors 68 and 70 (which junction serves as the output of the amplifier-inverter stage 62) is a voltage which has a first magnitude when the integrated circuit 12 quiescent current $I_{DDQ}$ is above a predetermined level, and a second magnitude when the $I_{DDQ}$ is below a certain value. Thus, the voltage present at the output of the amplifier-inverter stage 62 provides a "pass" or "fail" indication of the operation of the integrated circuit 12.

The foregoing describes a current sensor 10 for sensing the quiescent current in an integrated circuit 12 to detect defects, if any, in the circuit. All of the elements of the current sensor 10 (i.e., the diodes 14 and 28, and the transistors 20–26, 30–36, 42–48, 50–54, 58–60 and 64–70) can be fabricated, using conventional CMOS techniques, thereby allowing the current sensor to be "built in" a CMOS integrated circuit.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for detecting faults in an integrated circuit powered from a supply voltage $V_{DD}$, composing the steps of:
    sinking current drawn by the integrated circuit during each interval that the circuit undergoes a logic transition;
    sensing the current drawn by the integrated circuit during intervals other than when the integrated circuit undergoes a logic transition;
    translating the sensed current to a corresponding sensed voltage;
    comparing the sensed voltage to a reference voltage representative of a quiescent current expected to be drawn by the integrated circuit during intervals other when the integrated circuit undergoes a logic transition;
    generating an indicating voltage in accordance with a difference between the sensed and reference voltages so as to indicate whether the quiescent current of the integrated circuit is above a expected quiescent current; and
    stabilizing the indicating voltage against variations in the supply voltage $V_{DD}$.

2. The method according to claim 1 wherein the steps of sinking current and sensing the current drawn by the integrated circuit device are practiced by passing current from the integrated circuit through a diode coupled in series-aiding fashion between the integrated circuit and a negative bias voltage $V_{SS}$.

3. The method according to claim 2 wherein the current passing in the diode is regulated to control a sensitivity of the current sensed thereby.

4. The method according to claim 3 wherein the current in the diode is regulated by the steps of:
    coupling a field effect transistor between a circuit ground and the junction of the diode and the integrated circuit; and
    controlling the current passing in the transistor.

5. A current sensor for measuring a quiescent current drawn by an integrated circuit, when supplied with a supply voltage $V_{DD}$, to detect possible faults, comprising:
    a current sink and voltage transducer coupled to the integrated circuit for sinking current from the integrated circuit during intervals that the integrated circuit undergoes a logic transition and for providing a voltage in accordance with a quiescent current in the integrated circuit drawn during intervals other than when the integrated circuit undergoes a logic transition;
    a voltage comparator for comparing the voltage provided by the current sink and voltage transducer to a reference voltage representative of a prescribed quiescent current for the integrated circuit;
    a pre-amplifier stage coupled to the voltage comparator for providing an indicating voltage varying in accordance with a difference between the voltage provided by the current sink and voltage transducer and the reference voltage; and
    a stabilizing stage coupled to the pre-amplifer stage for stabilizing the indicating voltage against variations in the supply voltage.

6. The apparatus according to claim 5 wherein the current sink and voltage transducer comprises a diode coupled in series-aiding fashion with the integrated circuit between the supply voltage $V_{DD}$ and a negative bias voltage $V_{SS}$.

7. The apparatus according to claim 6 wherein the voltage comparator comprises:
    first and second field effect transistors having their drain-to-source portions coupled in series-aiding fashion between a fixed voltage and circuit ground, the first transistor having its gate coupled to a junction between the transistors and the second transistor having its gate coupled to the current sink and voltage transducer;
    third and fourth field effect transistors having their drain-to-source portions coupled in series-aiding fashion between a fixed voltage and circuit ground, the third transistor having its gate coupled to the junction between the third and fourth transistors; and
    a second diode coupled between a gate of the fourth transistor and the negative voltage bias supply $V_{SS}$.

8. The apparatus according to claim 7 further including means for regulating the current in each of the first and second diodes.

9. The apparatus according to claim 8 wherein the means for regulating the current in each of the first and second diodes comprises:
    a fifth field effect transistor having its source-to-drain portion coupled between a junction of the first diode and the integrated circuit, and circuit ground;
    a sixth field effect transistor having its source-to-drain portion coupled across the second diode; and a voltage divider network for supplying a portion of the supply voltage $V_{DD}$ to a gate of each of the fifth and sixth transistors.

10. The apparatus according to claim 9 wherein the voltage divider network comprises:

seventh and eighth field effect transistors having their drain-to-source portions coupled in series-aiding fashion between the supply voltage $V_{DD}$ and circuit ground, each transistor having its gate coupled to the source thereof, the junction between the seventh and eighth transistors coupled to the gate of the fifth and sixth transistors.

11. The apparatus according to claim 5 wherein the stabilizing stage comprises:

a pair of field effect transistors having their source-to-drain portions coupled in series-opposing fashion between the supply voltage $V_{DD}$ and circuit ground, a first one of the pair of transistors being supplied at its gate with the output of the pre-amplifier stage and the other transistor of the pair having its gate coupled to a junction between the transistors.

12. The apparatus according to claim 5 further including an amplifier-inverter for amplifying and inverting the indicating voltage stabilized by the stabilizing stage.

* * * * *